(12) United States Patent
Peterson et al.

(10) Patent No.: US 6,844,623 B1
(45) Date of Patent: Jan. 18, 2005

(54) TEMPORARY COATINGS FOR PROTECTION OF MICROELECTRONIC DEVICES DURING PACKAGING

(75) Inventors: Kenneth A. Peterson, Albuquerque, NM (US); William R. Conley, Tijeras, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 09/955,722

(22) Filed: Sep. 18, 2001

Related U.S. Application Data (62) Division of application No. 09/572,562, filed on May 16, 2000, now Pat. No. 6,335,224.

(51) Int. Cl.$^7$ .............................................. H01L 23/34
(52) U.S. Cl. ...................... 257/723; 257/724; 257/682; 257/687; 257/701; 257/702
(58) Field of Search ................................ 257/723, 724, 257/682, 687, 701, 702; 438/464, 465, 460

(56) References Cited

U.S. PATENT DOCUMENTS

| | | | | |
|---|---|---|---|---|
| 4,691,225 A | * | 9/1987 | Murakami et al. | 257/693 |
| 5,291,062 A | * | 3/1994 | Higgins, III | 257/698 |
| 5,516,728 A | * | 5/1996 | Degani et al. | 438/465 |
| 5,600,071 A | * | 2/1997 | Sooriakumar et al. | 73/721 |
| 5,766,367 A | * | 6/1998 | Smith et al. | 134/2 |
| 5,872,046 A | * | 2/1999 | Kaeriyama et al. | 438/465 |
| 5,923,995 A | * | 7/1999 | Kao et al. | 438/460 |
| 6,110,537 A | * | 8/2000 | Heffner et al. | 427/448 |
| 6,140,144 A | * | 10/2000 | Najafi et al. | 438/53 |
| 6,319,740 B1 | * | 11/2001 | Heffner et al. | 438/26 |
| 6,351,030 B2 | * | 2/2002 | Havens et al. | 257/690 |

OTHER PUBLICATIONS

C–Shield Parylene allows major weight saving for EM Shielding of microelectronics, Jan Noordegraaf et al. IEEE 1997.*

Internal Conformal Coating for Microcircuits, Whittington et al. IEEE 1978.*

Hermetic Plastic packages with Applications to Ruggedized Boards, Val et al. IEEE 1991.*

Alkltrichlorosilance–Based Self Assembled Monolayer Films for Stiction Reduction in Silicon Micromachines, Srinivasan et al. IEEE 1998.*

Wu et al., Interface–Adhesion–Enhanced Bi–layer Conformal Coating for Avionics Application, 1999 International Symposium on Advanced Packaging Materials, p. 302–310.*

* cited by examiner

*Primary Examiner*—Tom Thomas
*Assistant Examiner*—Eugene Lee
(74) *Attorney, Agent, or Firm*—Robert D. Watson (57) ABSTRACT

The present invention relates to a method of protecting a microelectronic device during device packaging, including the steps of applying a water-insoluble, temporary protective coating to a sensitive area on the device; performing at least one packaging step; and then substantially removing the protective coating, preferably by dry plasma etching. The sensitive area can include a released MEMS element. The microelectronic device can be disposed on a wafer. The protective coating can be a vacuum vapor-deposited parylene polymer, silicon nitride, metal (e.g. aluminum or tungsten), a vapor deposited organic material, cynoacrylate, a carbon film, a self-assembled monolayered material, perfluoropolyether, hexamethyldisilazane, or perfluorodecanoic carboxylic acid, silicon dioxide, silicate glass, or combinations thereof. The present invention also relates to a method of packaging a microelectronic device, including: providing a microelectronic device having a sensitive area; applying a water-insoluble, protective coating to the sensitive area; providing a package; attaching the device to the package; electrically interconnecting the device to the package; and substantially removing the protective coating from the sensitive area.

16 Claims, 4 Drawing Sheets

TEMPORARY COATINGS FOR PROTECTION OF MICROELECTRONIC DEVICES DURING PACKAGING

CROSS-REFERENCE TO RELATED APPLICATIONS

This application is a division of application Ser. No. 09/572,562, filed May 16, 2000, which issued as U.S. Pat. No. 6,335,224 on Jan. 1, 2002, "Protection of Microelectronic Devices During Packaging", by Peterson and Conley, which is herein incorporated by reference.

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

This invention relates generally to the field of microelectronics and more specifically to packaging of microelectromechanical systems (MEMS) and integrated microelectromechanical systems (IMEMS) devices.

Examples of MEMS and IMEMS devices include airbag accelerometers, microengines, optical switches, gyroscopic devices, sensors, and actuators. IMEMS devices can combine integrated circuits (IC's), such as CMOS or Bipolar circuits, with the MEMS devices on a single substrate, such as a multi-chip module (MCM). All of these devices use active elements (e.g. gears, hinges, levers, slides, and mirrors). These freestanding structures must be free to move, rotate, etc. Additionally, some types of microelectronics devices, such as microsensors, must be freely exposed to the environment during operation (e.g. for chemical, pressure, or temperature measurements).

For current commercially packaged MEMS and IMEMS components, the steps of packaging and testing can account for at least 70% of the cost. The current low-yield of MEMS packaging is a "show-stopper" for the eventual success of MEMS. Conventional electronic packaging methods, although expensive, are not presently adequate to carry these designs to useful applications with acceptable yields and reliability.

During conventional MEMS fabrication, silicon dioxide or silicate glass is a sacrificial material commonly used at the wafer scale to enable creation of complex three-dimensional structural shapes from polycrystalline silicon (e.g. polysilicon). The glass sacrificial layer surrounds and covers the multiple layers of polysilicon MEMS elements, preventing them from moving freely during fabrication. At this stage, the MEMS elements are referred to as being "unreleased".

The next step is to "release" and make free the MEMS elements. Conventionally, this is done by dissolving or etching the glass sacrificial coating in liquid mixtures of hydrofluoric acid, hydrochloric acid, or combinations of the two acids. This wet etching step is typically done at the wafer scale in order to reduce processing costs. Alternatively, a dry release etch may be performed by exposing the wafer to a plasma containing reactive oxygen, chlorine, or fluorine ions. Herein, the word "wafer" can include silicon; gallium arsinide (GaAs); or quartz wafers or substrates (e.g. for MEMS structures).

After releasing the active elements, the MEMS devices can be probed to test their functionality. Unfortunately, probed "good" MEMS are then lost in significant quantity due to damage during subsequent packaging steps. They can be damaged because they are unprotected (e.g. released). Subsequent processing steps can include sawing or cutting (e.g. dicing) the wafer into individual chips or device dies (e.g. dicing); attaching the device to the package (e.g. die attach), wirebonding or other interconnection methods, such as flip-chip solder bumping, or direct metallization (e.g. interconnecting); pre-seal inspection; sealing of hermetic or dust protection lids; windowing; package sealing; plating; trim; marking; final test; shipping; storage; and installation. Potential risks to the delicate released MEMS elements include electrostatic effects, dust, moisture, contamination, handling stresses, and thermal effects. For example, ultrasonic bonding of wirebond joints can impart harmful vibrations to the fragile released MEMS elements.

One solution to this problem is to keep the original sacrificial glass coating intact for as long as possible. In one approach, the MEMS elements would be released after all of the high-risk packaging steps have been completed (including sawing of the wafer into chips). Another approach (which relates to the present invention) would be to release the MEMS elements at the wafer scale; apply any performance-enhancing coatings; re-apply a temporary, replacement protective coating prior to wafer sawing; and, finally, remove the protective coating after all of the high-risk packaging steps have been completed.

In order to reduce the costs of MEMS fabrication and packaging, it is desirable to perform as many fabrication steps at the wafer scale (e.g. before sawing the wafer into individual device dies). An example of a wafer scale process is deposition of performance-enhancing coatings on released MEMS elements (e.g. anti-stiction films and adhesion-inhibitors). Unfortunately, if these coatings are applied at the wafer scale (obviously, on released MEMS elements), then some of these performance-enhancing coatings may also be unintentionally deposited on the backside of the wafer. These unwanted coatings can interfere with the subsequent die attachment step. Also, the subsequent removal of these unwanted backside coatings can damage or contaminate the released MEMS elements.

Likewise, application of adhesion-promoting coatings (e.g. for die attachment) to the backside of the wafer may similarly damage the released MEMS elements by unintentional contamination or adsorption of harmful materials.

What is desired is a process that first releases the MEMS elements at the wafer scale; then applies all of the desired performance-enhancing coatings to the released MEMS elements; followed by re-application of a temporary protective coating; followed by cleanup of unwanted coatings unintentionally applied to the wafer's backside, followed by cutting the wafer into individual device dies.

Another desirable goal is to replace conventional wet etching processes with dry etching processes; to reduce costs, and because of an increasing emphasis on using environmentally friendly fabrication and cleaning processes. Especially for IMEMS devices, which can contain CMOS or Bipolar structures and other semiconductor materials, aggressive wet etchants used to release MEMS elements can damage the CMOS or Bipolar structures if they are not sufficiently protected. Standard photoresist protection used on CMOS or Bipolar chips may not provide sufficient protection from attack by acid etchants.

Wet etching processes can have other problems. Large hydrodynamic forces may be unintentionally applied to the fragile released MEMS elements, such as when agitating within a bath, and can fracture thin elements. Also, improper removal of any liquid film can create stiction problems resulting from capillary effects during the process of immersion in, removal from, and drying of liquid solutions. Using dry processing can eliminate these potential sources of damage.

What is also desired is using a dry etching process, preferably single-step, for removing protective coatings from MEMS devices. It is also desired that the dry etching process can be stopped before completely removing all of the protective coating, of: thereby leaving some desirable residual material that may reduce friction and may reduce tolerances between bearing surfaces, potentially reducing wobble in rotating gears and discs.

The list of desired objects described above could apply to microelectronics devices other than MEMS or IMEMS, such as microsensors. Microsensors also have a need for temporary protection of sensitive areas during packaging steps.

None of the approaches discussed above provides a low-cost, high-yield, high-capacity commercial wafer-scale, water-insoluble, protection film or coating that provides MEMS and IMEMS stabilization and protection during device packaging.

Use of the word "MEMS" is intended to also include "IMEMS" devices, unless specifically stated otherwise. Likewise, the word "plastic" is intended to include any type of flowable dielectric composition. The word "film" is used interchangeably with "coating", unless otherwise stated. The phrases "released MEMS elements", "sensitive area", "released MEMS devices", and "active MEMS elements" are used interchangeably to refer to the freely-movable structural elements, such as gears, pivots, hinges, sliders, etc.; and also to exposed active elements (e.g. flexible membranes) for microsensors (e.g. chemical, pressure, and temperature microsensors).

BRIEF DESCRIPTION OF THE DRAWINGS

The accompanying drawings, which are incorporated in and form part of the specification, illustrate various embodiments of the present invention and, together with the description, serve to explain the principles of the invention.

DETAILED DESCRIPTION OF THE INVENTION

The present invention relates to a method of protecting a microelectronic device during device packaging, comprising, in the order presented: providing a microelectronic device having a sensitive area; applying a water-insoluble, protective coating to the sensitive area; performing at least one packaging step; and then substantially removing the protective coating from the sensitive area.

Figure 1A:
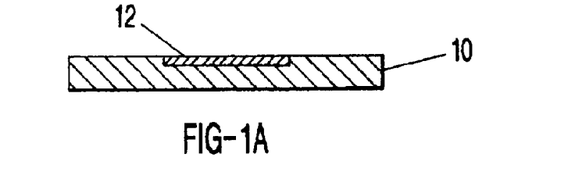
FIG. 1A shows a schematic cross-section view of a first example, according to the present invention, of a microelectronic device with a sensitive area.

FIG. 1A shows a schematic cross-section view of a first example, according to the present invention, of a microelectronic device 10 with a sensitive area 12. Examples of microelectronic device 10 can include an airbag accelerometer, a microengine, an optical switch, a gyroscopic device, a microsensor, and a microactuator. Microelectronic device 10 can include microelectromechanical systems (MEMS) that have MEMS elements (e.g. gears, hinges, levers, slides, and mirrors). These freestanding MEMS elements must be free to move, rotate, etc during MEMS operation. Microelectronic device 10 can also include IMEMS devices, which combine integrated circuits (IC's), such as CMOS or Bipolar circuits, with MEMS devices on a single substrate, such as a multi-chip module (MCM). Microelectronics device 10 can also include microsensors, which must be freely-exposed to the environment during operation (e.g. for chemical, pressure, or temperature measurements). Microelectronics device 10 can also include microfluidic systems, such as used in Chemical-Lab-on-a-Chip systems.

Figure 1B:
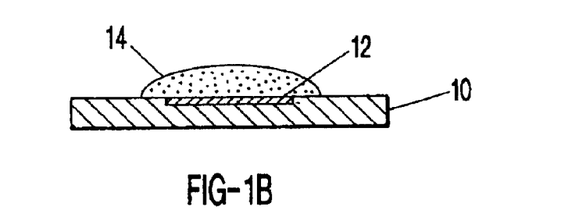
FIG. 1B shows a schematic cross-section view of a first example, according to the present invention, that is similar to FIG. 1A, after a water-insoluble protective coating has been applied to the sensitive area.

FIG. 1B shows a schematic cross-section view of a first example, according to the present invention, that is similar to FIG. 1A, after a water-insoluble protective coating 14 has been applied to the sensitive area 12. The application of protective coating 14 can potentially prevent damage due to external contamination, debris, moisture, cutting fluids, handling forces, electrostatic effects, etc. Sensitive area 12 can include a released MEMS element, an IC, an optically active surface, a chemically-sensitive surface, a pressure-sensitive surface, or a temperature-sensitive surface. Examples of optically active devices include charge coupled devices (CCD), photocells, laser diodes, vertical cavity surface emitting lasers (VCSEL's), and UV erasable programmable read-only memory chips (UV-EPROM's). While some of these devices emit light, and while others receive light; both are considered to be "optically active".

The ideal protective coating 14 would be water-insoluble, vacuum vapor-deposited, strong, pure, inert, defect-free, dry-etchable, and conformal. Coatings made from parylene generally satisfy these requirements. Other suitable protective coatings can include silicon nitride, metal (e.g. aluminum or tungsten), a vapor deposited organic material, cynoacrylate, a carbon film, a self-assembled monolayered material, perfluoropolyether, hexamethyldisilazane, or perfluorodecanoic carboxylic acid, silicon dioxide, silicate glass, or combinations thereof. Other glass formulations (e.g. containing boron or phosphorous) can be used which have the desirable property of being more rapidly etched (e.g. fast-etch glass), even though other properties (e.g. dielectric strength) may not be as good as compared to pure silicon dioxide. Alternatively, amorphous carbon films, or diamond-like carbon films (DLC) can be used.

The preferred water-insoluble protective coating 14 is a material chosen from the family of vacuum vapor-deposited (e.g. CVD or PECVD) materials called "parylene". Other polymer coatings could be used, for example: epoxies, acrylics, urethanes, and silicones. However, those other coatings are generally applied in the liquid state, whereas parylene is applied in the vapor-phase. Liquid coatings generally do not conform as well to the complex 3-D shaped, multi-layer MEMS elements as vacuum vapor-deposited conformal coatings, such as parylene.

Parylene is the generic name for members of a unique polymer series originally developed by the Union Carbide Corporation. The basic member of the series is poly-para-xylylene; a completely linear, highly crystalline material called Parylene N. Parylene N is a primary dielectric, exhibiting a very low dissipation factor, high dielectric strength, and a dielectric constant invariant with frequency. Parylene C, the second commercially available member of the Union Carbide series, is produced from the same monomer, which has been modified by the substitution of a chlorine atom for one of the aromatic hydrogens. Parylene C has passed the NASA Goddard Space Flight Center outgassing test. Parylene C has a useful combination of electrical and physical properties plus a very low permeability to moisture and other corrosive gases. It also has the ability to provide a true pinhole-free conformal insulation. For these reasons, Parylene C is a preferred material for coating critical electronic assemblies.

Parylene D, the third member of the Union Carbide series, is produced from the same monomer, but modified by the substitution of the chlorine atom for two of the aromatic hydrogens. Parylene D has similar properties to Parylene C, but with the ability to withstand higher use temperatures. Due to the uniqueness of the vapor phase deposition, the parylene family of polymers can be formed as structurally continuous films as thin as a fraction of a micrometer, to as thick as several thousandths of an inch.

Vacuum vapor-deposited parylene coatings 14 are applied to specimens in an evacuated deposition chamber by means of gas phase polymerization. The parylene raw material, di-para-xylylene dimer, is a white crystalline powder manufactured by Union Carbide Corporation, Danbury, Conn. under the product name "Parylene Dimer DPX-N". First, the powder is vaporized at approximately 150 degrees C. Then it is molecularly cleaved (e.g. pyrolyzed) in a second process at about 680 degrees C. to form the diradical, para-xylylene, which is then introduced as a monomeric gas that polymerizes on the specimens in the vacuum chamber at room temperature. There is no liquid phase in the deposition process, and specimen temperatures remain near ambient. The coating grows as a pure, defect-free, self-assembling, conformal film on all exposed surfaces, edges, and crevices.

During the deposition stage, the active (cured) monomeric gas polymerizes spontaneously on the surface of coated specimen at ambient temperature with no stresses induced initially or subsequently. In short, there are no cure-related hydraulic or liquid surface tension forces in the process. Parylenes are formed at a vacuum of approximately 0.1 torr, and under these conditions the mean-free-path of the gas molecules in the deposition chamber is in the order of 0.1 cm. In the free molecular dispersion of the vacuum environment, all sides of an object to be coated are uniformly impinged by the gaseous monomer, resulting in a high degree of conformity. Polymerization occurs in crevices, under devices, and on exposed surfaces at the same rate of about 0.2 microns per minute for Parylene C, and a somewhat slower rate for parylene N. The deposition rate depends strongly on processing conditions.

Parylene possesses useful dielectric and barrier properties per unit thickness, as well as extreme chemical inertness and freedom from pinholes. Since parylene is non-liquid, it does not pool, bridge, or exhibit meniscus or capillary properties during application. No catalysts or solvents are involved, and no foreign substances are introduced that could contaminate coated specimens. Parylene thickness is related to the amount of vaporized dimer and dwell time in the vacuum chamber, and can be controlled accurately to +/−5% of final thickness. The vacuum deposition process makes parylene coating relatively simple to control, as opposed to liquid materials, where neither thickness nor evenness can be accurately controlled. Parylene film meets typical printed wiring assembly coating protection and electrical insulating standards; as specified by MIL-I-46058. The coating's thickness is controllable from as little as 100 Angstroms, to hundreds of microns.

The parylene polymer coatings have fairly good adhesion to epoxy molding compounds. Interestingly, parylene monomer is soluble in epoxy gel-coat. Here, parylene polymer is formed under the surface of the epoxy, resulting in an interpenetrating polymer network and an especially effective mechanism for adhesion, if required.

Curing occurs during deposition; therefore no high temperature curing step is required. Since parylene is applied in a non-liquid state, there are no hydrodynamic forces that could damage the fragile released MEMS elements. Deposition also takes place at ambient temperatures, which minimize thermal or chemical cure stresses. Parylene's static and dynamic coefficients of friction are in the range of 0.25 to 0.33 (in air), which makes this coating only slightly less lubricious than TEFLON. Because the parylene deposition process is spontaneous, and does not require a cure catalyst, it is therefore extremely pure and chemically inert.

Parylene polymers resist attack and are insoluble in all organic solvents up to 150 C, including water. Parylene C can be dissolved in chloro-naphthalene at 175 C, and Parylene N is soluble at the solvent's boiling point of 265 C. Parylene coatings can be removed by many processes, including oxygen or ozone reactive ion plasma exposure; and laser ablation. Oxygen-based plasma exposure does not harm the polysilicon structural elements of MEMS devices. Dry etching of parylene coatings is generally faster than dry etching of silicon dioxide glass coatings, which supports the preferred choice of parylene for use as the protective coating 14, as compared to using silicon dioxide glass.

Reactive parylene monomers can be blended with other reactive materials to form copolymer compounds, including silicon, carbon, and fluorine containing monomers (including siloxanes). Additional information on the formation and composition of thin parylene films on semiconductor substrates for use as a low-dielectric, insulating coating is contained in U.S. Pat. No. 5,958,510 to Sivaramakrishnam, et al., and in U.S. Pat. No. 6,030,706, to Eissa, et al. Both patents are herein incorporated by reference in their entirety.

Figure 1C:
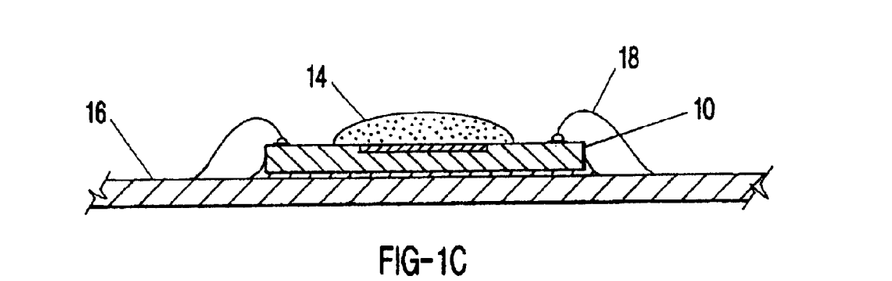
FIG. 1C shows a schematic cross-section view of a first example, according to the present invention, that is similar to FIG. 1B, after the device has been attached and wirebonded to a substrate.

FIG. 1C shows a schematic cross-section view of a first example, according to the present invention, that is similar to FIG. 1B, after device 10 has been conventionally attached to substrate 16, and electrically interconnected to substrate 16 with wirebonds 18. Other packaging steps, well-known to those skilled in the art, could be performed at this stage, such as encasing the wirebonds in a plastic material (not shown). Protective coating 14 protects sensitive area 12 during these packaging steps.

Figure 1D:
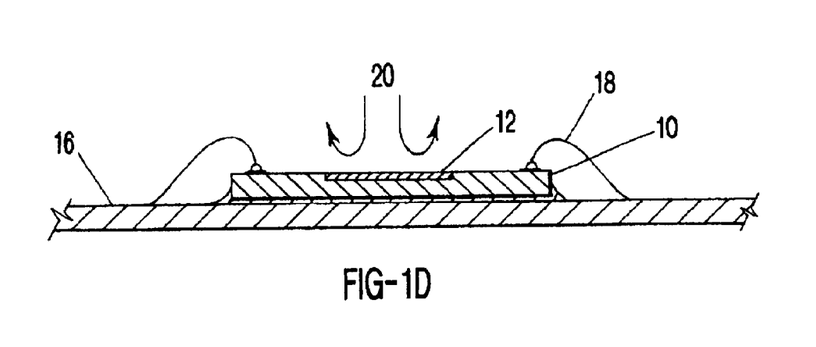
FIG. 1D shows a schematic cross-section view of a first example, according to the present invention, that is similar to FIG. 1C, after the protective coating has been removed by etching, thereby exposing the sensitive area to the surrounding environment.

FIG. 1D shows a schematic cross-section view of a first example, according to the present invention, that is similar to FIG. 1C, after protective coating 14 has been substantially removed by using an etching process 20, thereby exposing sensitive area 12 to the surrounding environment.

A variety of etching solutions can be used to chemically remove coatings. Wet etching of silicon dioxide or silicate glass can use hydrofluoric or hydrochloric acid, followed by rinsing, and drying. Drying can include using supercritical drying and sublimation methods to reduce stiction problems. Etching solutions for removing plastic materials (e.g. epoxy resin and glob-top polymers) can include using fuming nitric acid, fuming sulfuric acid, or mixtures of the two acids.

Wet etching can be performed with a commercially available device conventionally called a "decapsulatoe", or "jet etcher". such a device removes material by directing a stream of (sometimes heated) acid etchant perpendicular to the surface being etched. A gasket can be used to confine the area being etched. The etching solutions can be heated to 250 C, and +/−1% temperature control is provided. An example of a decapsulator device is the "D Cap-Delta" dual acid system sold by B&G International, Santa Crux, Calif., 95060. Other decapsulating devices are also described in U.S. Pat. No. 5,855,727 to Martin, et al.; and in U.S. Pat. No. 5,932,061 to Lam.

Alternatively, dry plasma etching can be used to substantially remove protective coating 14, instead of wet etching. Dry etching processes are generally less damaging to the fragile MEMS elements than wet processes. Plasma etching can include reactive ion etching and ion milling with chemically active ions (e.g. oxygen, chlorine, or fluorine ions). Exposure to ozone in the presence of UV radiation can also be used for dry etching. It is critical that the release process does not substantially damage other features on the microelectronic device, such as metal interconnects.

Another dry etching process is exposure to gas or gases. For example, chlorine gas can be used to etch a tungsten protective coating, and xenon diflouride can be used to etch silicon.

Figures 2A, 2B:
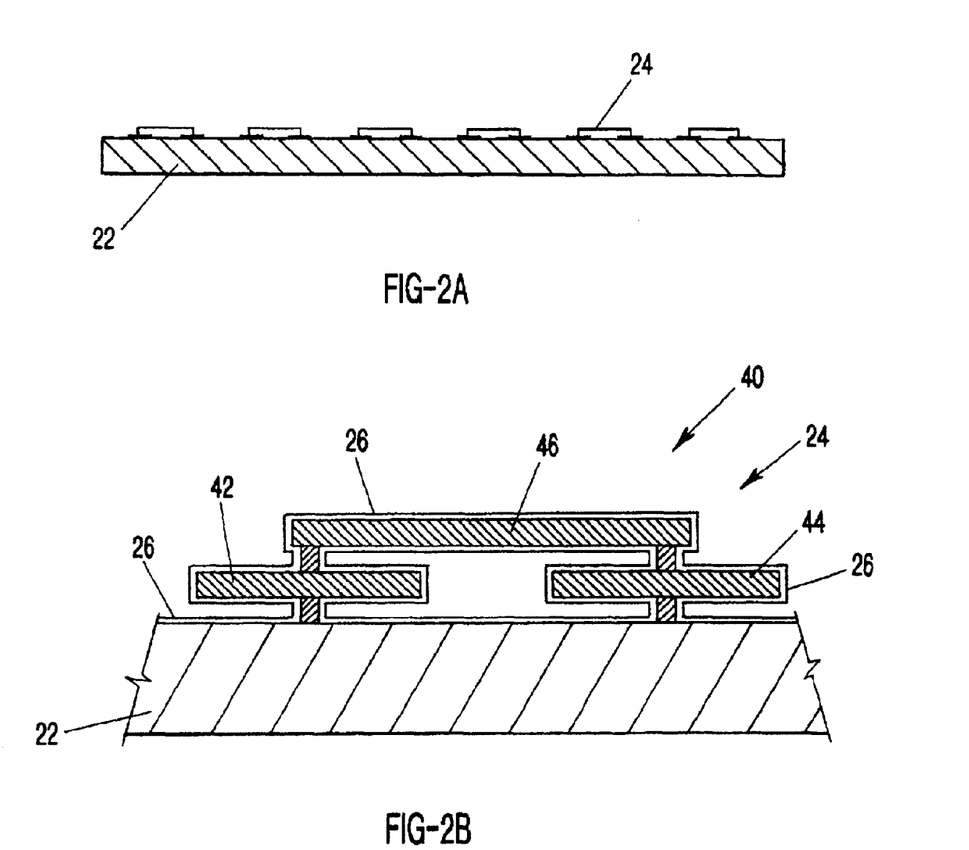
FIG. 2A shows a schematic cross-section view of a second example, according to the present invention, of a wafer substrate with already released MEMS elements located on the wafer's topside.
FIG. 2B shows a schematic cross-section view of a second example, according to the present invention, that is similar to FIG. 2A, after an anti-stiction coating has been applied to the released MEMS elements.

FIG. 2A shows a schematic cross-section view of a second example, according to the present invention, of a wafer 22 with a plurality of already released MEMS elements 24 located on the wafer 22.

FIG. 2B shows a schematic cross-section view of a second example, according to the present invention, that is similar to FIG. 2A, after an optional anti-stiction coating 26 has been applied to the released MEMS elements. Anti-stiction coating 26 in FIG. 2B is an example of a class of performance enhancing and/or proprietary films that can be applied to released MEMS elements 24. A schematic MEMS device 40 as shown having MEMS elements 24 comprising two polysilicon gears 42, 44 and a linkage bar 46. Examples of performance-enhancing films include anti-stiction films, adhesion-inhibitors, lubricants (e.g. perfluoropolyether, hexamethyldisilazane, or perfluorodecanoic carboxylic acid), and nitrided-surfaces that reduce friction between moving (e.g. polysilicon) surfaces. In U.S. Pat. No. 5,766,367, "Method for Preventing Micromechanical Structures from Adhering to Another Object", Smith, et al. discloses the formation of an adhesion-inhibiting hydrophilic coating by immersing the MEMS components in a solvent containing hexamethyldisilazane. U.S. Pat. No. 5,766,367 is herein incorporated by reference In its entirety. Also, vapor-deposited, self-assembling monolayer (SAM) lubricants, such as perfluorodecanoic carboxylic acid, can be used. Finally, some degree of humidity can also help to increase lubricity.

Figure 2C:
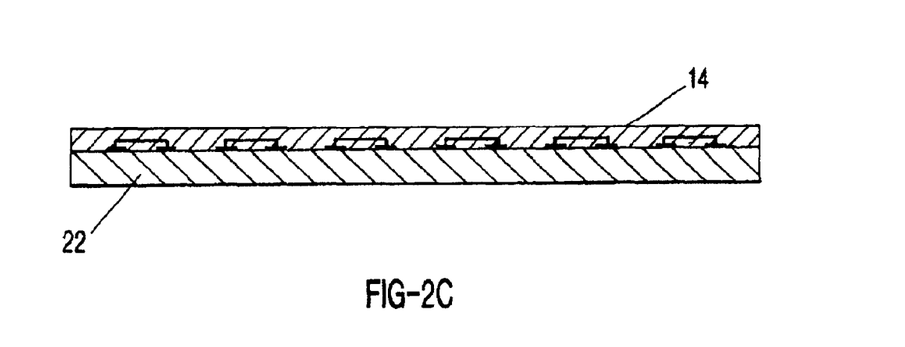
FIG. 2C shows a schematic cross-section view of a second example, according to the present invention, that is similar to FIG. 2B, after a water-insoluble protective coating has been applied to the released MEMS elements, on top of the anti-stiction coating of FIG. 2B. The coating can be a vacuum vapor deposited parylene coating.

FIG. 2C shows a schematic cross-section view of a second example, according to the present invention, that is similar to FIG. 2B, after water-insoluble protective coating 14 has been applied to the released MEMS elements 24, on top of the anti-stiction coating of FIG. 2B. Protective coating 14 substantially encapsulates the released MEMS elements 24, thereby inactivating them and protecting them with a durable coating. Coating 14 can be a vacuum vapor-deposited parylene coating. Coating 14 can be applied to the entire topside of wafer 22 without the need for masking or patterning. However, the backside of wafer 22 may be covered to prevent unwanted deposition thereon of coating 14. Preparation of the wafer's backside can include cleaning of unintentionally-deposited materials on the wafer's backside (such as anti-stiction films or MEMS lubricants); removing the native oxide film; and/or deposition of adhesion-enhancing layers to the backside, such as gold. Since MEMS elements 24 are stabilized and protected by protective coating 14, these optional backside preparation steps can be performed using conventional techniques, and without a requirement for extraordinary care.

Figure 2D:
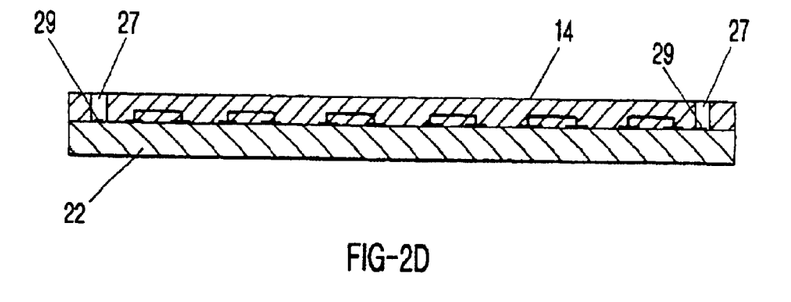
FIG. 2D shows a schematic cross-section view of a second example, according to the present invention, that is similar to FIG. 2C, after bond pads have been exposed by machining vias in the coatings.

FIG. 2D shows a schematic cross-section view of a second example, according to the present invention, that is similar to FIG. 2C, after bond pads 29 have been optionally exposed by machining vias 27 in the coatings. Vias 27 can be defined by photolithography, and can be fabricated by using processes well-known in the art (e.g. e-beam ablation, laser ablation, and water-jet cutting).

Figure 2E:
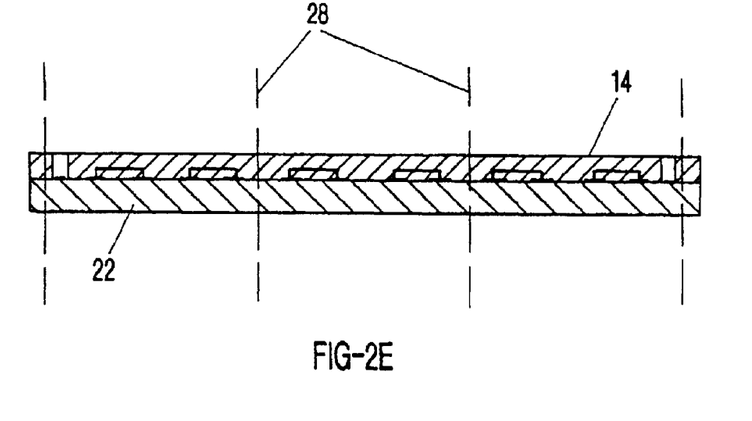
FIG. 2E shows a schematic cross-section view of a second example, according to the present invention, that is similar to FIG. 2D, wherein the wafer is being cut into individual device dies by diamond saw cutting or laser dicing.

FIG. 2E shows a schematic cross-section view of a second example, according to the present invention, that is similar to FIG. 2D, wherein wafer 22 is being cut into individual device dies 28 by using processes well-known in the art (e.g. diamond saw cutting, water-jet cutting, and laser dicing). MEMS elements 24 are protected by coating 14 from damage from cutting debris and lubricant fluids that are typically used during wafer dicing. Alternatively, protective coating 14 could be patterned in a manner to exclude coating 14 from the wafer saw streets (e.g. lines where the saw cuts along), prior to saw cutting. This would be desirable to avoid contaminating the dicing saw with unwanted debris (e.g. organic debris) generated by cutting of coating 14. Exclusion of coating 14 from the wafer saw streets can be accomplished by masking during deposition of the coating. Alternatively, the coating can be removed from the wafer's saw streets by wet or dry etching using a patterned mask. An optional cleaning step can be performed after dicing wafer 22.

Figure 2F:
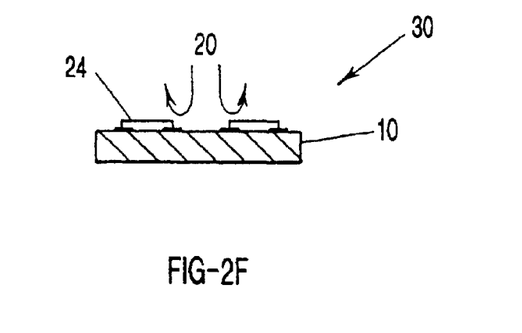
FIG. 2F shows a schematic cross-section view of a second example, according to the present invention, that is similar to FIG. 2E, wherein the protective coating is being removed by etching, thereby re-releasing the MEMS elements.

FIG. 2F shows a schematic cross-section view of a second example, according to the present invention, that is similar to FIG. 2E, wherein protective coating 14 is being substantially removed by etching process 20, thereby re-releasing the MEMS element 24, and producing a released MEMS device die 30. It is important that the etching process 20 does not also remove any performance-enhancing coatings, such as anti-stiction coating 26. Optional probe testing of each MEMS or IMEMS device die 30 can be performed at this stage to determine which ones are the "good" dies; since the released MEMS elements 24 are free and fully functional.

Figure 3A:
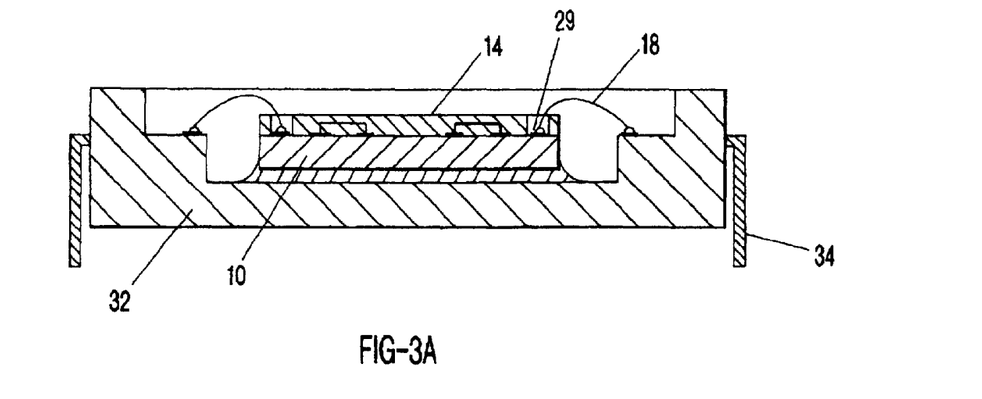
FIG. 3A shows a schematic cross-section view of a third example, according to the present invention, of a MEMS device attached and wirebonded to a package, with MEMS elements protected in a protective coating.

FIG. 3A shows a schematic cross-section view of a third example, according to the present invention, of a microelectronic device 10 attached and wirebonded to a package 32, with MEMS elements 24 protected in a protective coating 14. Package 32 has exterior electrical leads 34. Other interconnection methods, such as flip-chip solder bumps, or direct metallization, can be used in place of wirebonds. The use of protective coating 14 to encapsulate MEMS elements 24 permits a wide range of die attach processes and materials to be used without fear of adsorption of potentially harmful layers on the MEMS elements. Use of protective coating 14 also allows ultrasonic wirebonding or other interconnection steps to occur without damage due to mechanical vibrations or shock to the MEMS devices.

Figure 3B:
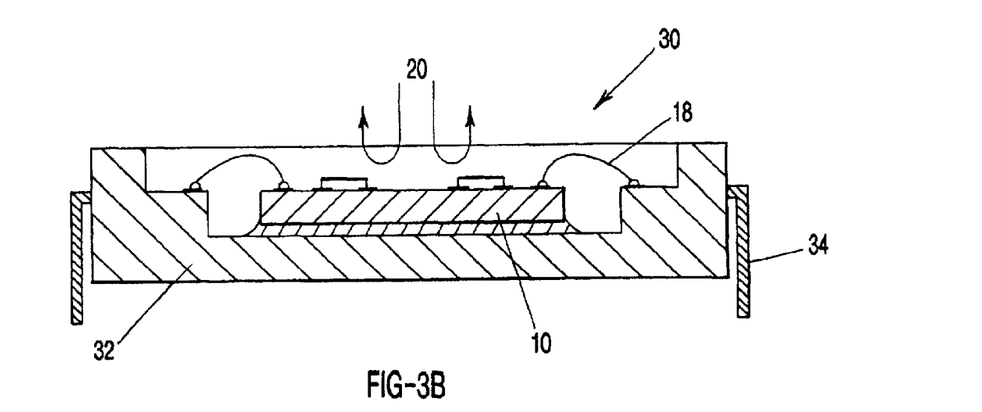
FIG. 3B shows a schematic cross-section view of a third example, according to the present invention, that is similar to FIG. 3A, wherein the protective coating is being removed by dry oxygen plasma etching, thereby re-releasing the MEMS elements.

FIG. 3B shows a schematic cross-section view of a third example, according to the present invention, that is similar to FIG. 3A, wherein the protective coating 14 is substantially removed by a dry oxygen plasma etching process 20, thereby re-releasing the MEMS elements 24.

Alternatively, in FIG. 3B, the protective coating 14 can be only partially removed, whereby some residual amount of protective coating 14 remains. While sufficient amount of coating 14 must be removed so that MEMS element 24 is released, there are three reasons for not completely removing protective coating 14. Firstly, it might not be desirable to remove the performance-enhancing films 26 (e.g. anti-stiction and lubricants) applied previously. This can be prevented by not removing all of protective coating 14. Secondly, leaving a thin layer of protective coating 14 in place may be desirable if coating 14 can act as its own lubricant. This second option could possibly eliminate the extra step of applying performance-enhancing films 26 in FIG. 2B. Thirdly, leaving a thin layer of coating 14 can possibly reduce micromachining tolerances between bearing surfaces, whereby wobble in gears and discs can be reduced, for example.

Figure 3C:
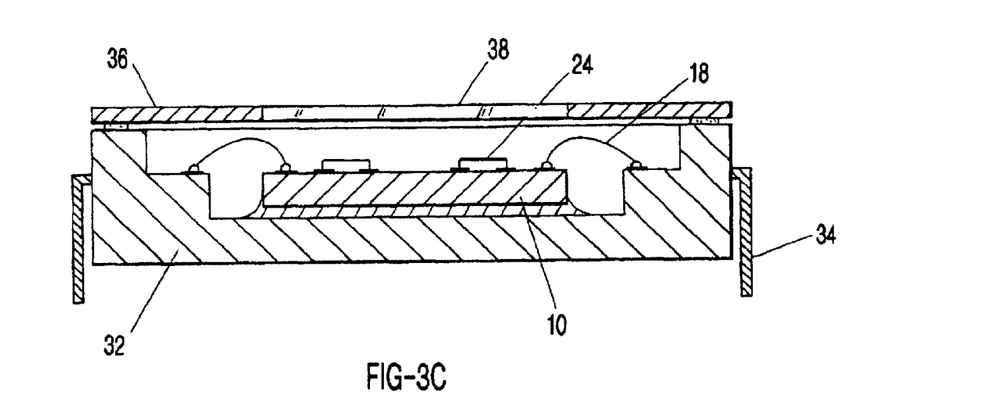
FIG. 3C shows a schematic cross-section view of a third example, according to the present invention, that is similar to FIG. 3B, wherein a cover lid with a window has been attached to the package, thereby completing the packaging of the released MEMS device.

FIG. 3C shows a schematic cross-section view of a third example, according to the present invention, that is similar to FIG. 3B, wherein a cover lid 36 has been attached to the package 32, thereby completing the packaging of the released MEMS device 30. Cover lid 36 can optionally include a window 38, for providing optical access to MEMS device 30. Optical access to operational MEMS devices can be useful for calibration, inspection, performance characterization, and failure analysis of MEMS elements.

The particular examples discussed above are cited to illustrate particular embodiments of the invention. Other applications and embodiments of the apparatus and method of the present invention will become evident to those skilled in the art. For example, although the figures illustrate only a single microelectronic device or MEMS device, the method described herein applies equally well to packaging of multiple MEMS or IMEMS devices, which can be arrayed in a 1-D or 2-D array. Also, the method of perforating one side of a plastic package can also be applied to an opposite side. One example of this can be perforating both sides of a pressures-sensitive area on a micropressor device that is encapsulated in plastic. By perforating both sides, the a pressure differential can be sensed from one side of the device to the other side. The actual scope of the invention is defined by the claims appended hereto.

We claim:

1. A temporarily protected, non-functioning MEMS device, comprising:

a released MEMS device disposed on a substrate; and a temporary, immobilizing coating directly contacting and immobilizing the released MEMS device; wherein the temporary, immobilizing coating is selected from the group consisting of parylene, carbon, amorphous carbon, diamond-like carbon, perfluoropolyether, and perfluorodecanoic carboxylic acid;

wherein the temporary, immobilizing coating is sufficiently thick so as to immobilize any movable elements of the released MEMS device; and wherein the temporary, immobilizing coating is insoluble in water and organic solvents; and wherein said temporarily protected, non-functioning MEMS device represents an intermediate step in the process of fabricating a fully-functional MEMS device.

2. The temporarily protected, non-functioning MEMS device of claim 1, wherein the substrate comprises a wafer comprising a plurality of released MEMS devices coated directly with the protective temporary immobilizing coating.

3. The temporarily protected, non-functioning MEMS device of claim 2, wherein the protective temporary, immobilizing coating is excluded from covering any wafer streets.

4. The temporarily protected, non-functioning MEMS device of claim 1, wherein the substrate comprises a die.

5. The temporarily protected, non-functioning MEMS device of claim 4, wherein the die is mechanically attached and electrically interconnected to a package.

6. The temporarily protected, non-functioning MEMS device of claim 4, wherein the die is wirebonded to the package.

7. The temporarily protected, non-functioning MEMS device of claim 4, wherein the die is flip-chip bonded to the package.

8. The temporarily protected, non-functioning MEMS device of claim 1, wherein the temporary, immobilizing coating comprises parylene; and wherein the parylene coating comprises one or more polymers selected from the group consisting of poly-para-xylylene, poly-para-xylylene modified by the substitution of a chlorine atom for one aromatic hydrogen, and poly-para-xylylene modified by the substitution of a chlorine atom for two aromatic hydrogens.

9. The temporarily protected, non-functioning MEMS device of claim 1, wherein the protective temporary, immobilizing coating comprises parylene; and wherein the parylene coating comprises a copolymer compound formed by blending a reactive parylene monomer with a reactive material.

10. A temporarily protected, non-functioning MEMS device of claim 9, wherein the reactive material comprises a monomer comprising one or more elements selected from the group consisting of silicon, carbon, and fluorine.

11. A temporarily protected, non-functioning wafer, comprising:
- a wafer comprising a plurality of released MEMS devices disposed on the wafer; and
- a protective temporary, immobilizing coating of parylene directly contacting and immobilizing the released MEMS devices;
- wherein the temporary, immobilizing coating is sufficiently thick so as to immobilize any movable elements of the released MEMS devices; and
- wherein the temporary, immobilizing coating protects the released MEMS devices during a die singulation step.

12. The temporarily protected, non-functioning wafer of claim 11, wherein the protective temporary, immobilizing coating of parylene is excluded from covering any wafer streets.

13. A temporarily protected, non-functioning MEMS device, comprising:
- a released MEMS device disposed on a die; and
- a protective temporary, immobilizing coating of parylene directly contacting and immobilizing the released MEMS device;
- wherein the protective temporary, immobilizing coating is sufficiently thick so as to immobilize any movable elements of the released MEMS device; and
- wherein said temporarily protected, non-functioning MEMS device represents an intermediate step in the process of fabricating a fully-functional MEMS device.

14. The temporarily protected, non-functioning MEMS device of claim 13, wherein the die is mechanically attached and electrically interconnected to a package.

15. The temporarily protected, non-functioning MEMS device of claim 14, wherein the die is wirebonded to the package.

16. The temporarily protected, non-functioning MEMS device of claim 14, wherein the die is flip-chip bonded to the package.

* * * * *